(12) United States Patent
Huang et al.

(10) Patent No.: US 10,276,608 B2
(45) Date of Patent: Apr. 30, 2019

(54) PATTERNING METHOD EMPLOYING HALF TONE MASK, ARRAY SUBSTRATE AND DISPLAY DEVICE

(71) Applicants: BOE TECHNOLOGY GROUP CO., LTD., Beijing (CN); Chongqing BOE Optoelectronics Technology Co., Ltd., Chongqing (CN)

(72) Inventors: Zhonghao Huang, Beijing (CN); Yongliang Zhao, Beijing (CN); Houfeng Zhou, Beijing (CN); Zhiyong Ning, Beijing (CN); Hongru Zhou, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 14 days.

(21) Appl. No.: 15/791,107

(22) Filed: Oct. 23, 2017

(65) Prior Publication Data
US 2018/0254289 A1    Sep. 6, 2018

(30) Foreign Application Priority Data

Mar. 1, 2017   (CN) .......................... 2017 1 0119773

(51) Int. Cl.
| | |
|---|---|
| *H01L 27/12* | (2006.01) |
| *H01L 21/027* | (2006.01) |
| *H01L 21/3213* | (2006.01) |
| *H01L 21/02* | (2006.01) |
| *H01L 21/3065* | (2006.01) |

(52) U.S. Cl.
CPC ...... *H01L 27/127* (2013.01); *H01L 21/02068* (2013.01); *H01L 21/0274* (2013.01); *H01L 21/3065* (2013.01); *H01L 21/32134* (2013.01); *H01L 27/1288* (2013.01)

(58) Field of Classification Search
CPC .......................... H01L 27/1288; H01L 27/127
See application file for complete search history.

(56) References Cited

U.S. PATENT DOCUMENTS

| | | | |
|---|---|---|---|
| 2012/0018308 A1* | 1/2012 | Shawcross | A61L 31/022 205/50 |
| 2014/0273496 A1* | 9/2014 | Kao | H01L 21/31144 438/743 |
| 2016/0020227 A1* | 1/2016 | Choi | G02F 1/1362 257/43 |

* cited by examiner

*Primary Examiner* — Lex H Malsawma
*Assistant Examiner* — Xia L Cross
(74) *Attorney, Agent, or Firm* — McDermott Will & Emery LLP

(57) ABSTRACT

A patterning method employing a half tone mask includes the steps of: successively forming a first thin film layer, a second thin film layer and a photoresist thin film layer on a substrate; exposing and developing the photoresist thin film layer by using a half tone mask plate; performing a first etching on the substrate that is exposed and developed; performing a second etching on the substrate that has been subject to the first etching; passivating the substrate that has been subject to the first etching; ashing the substrate that has been passivated; performing a third etching on the substrate that has been subject to the ashing and the second etching; and, stripping the substrate that has been subject to the third etching.

11 Claims, 9 Drawing Sheets

Test Pad

PATTERNING METHOD EMPLOYING HALF TONE MASK, ARRAY SUBSTRATE AND DISPLAY DEVICE

CROSS-REFERENCE TO RELATED APPLICATION

This application claims priority to Chinese Patent Application No. 201710119773.5, filed on Mar. 1, 2017, titled "PATTERNING METHOD EMPLOYING HALF TONE MASK, ARRAY SUBSTRATE AND DISPLAY DEVICE", which is incorporated herein by reference in its entirety.

TECHNICAL FIELD

The present disclosure relates to the technical field of display, and in particular to a patterning method employing a half tone mask, an array substrate and a display device.

BACKGROUND

A patterning method employing a half tone mask is to perform one exposure and multiple times of etching on two thin film layers by using a half tone mask plate to form two film patterns. Hereby, the manufacture process of an array substrate can be greatly simplified, and the manufacture cost can be reduced, so that this method becomes a common process for manufacturing an array substrate.

However, when two film patterns are formed by multiple times of etching in the patterning method employing a half tone mask, it is likely that a film pattern, close to a substrate, in the two film patterns on the substrate has a tail. This tail plays no role in the conduction and display. Meanwhile, when the array substrate is used for displaying, this tail will generate stray capacitance with electrode patterns of other film layers, thus resulting in the drawbacks of light leakage, increased power consumption and the like.

SUMMARY

An aspect of the embodiments of the present disclosure provides a patterning method employing a half tone mask, including the steps of: successively forming a first thin film layer, a second thin film layer and a photoresist thin film layer on a substrate; exposing and developing the photoresist thin film layer by using a half tone mask plate to obtain a photoresist pattern layer, the photoresist pattern layer including a photoresist-completely-reserved region, a photoresist-partially-reserved region and a photoresist-removed region; performing a first etching on the substrate that is exposed and developed to remove a portion of the second thin film layer corresponding to the photoresist-removed region; performing a second etching on the substrate that has been subject to the first etching to remove a portion of the first thin film layer corresponding to the photoresist-removed region to form a first pattern layer; passivating the substrate that has been subject to the first etching to form a protective layer on an exposed surface of a reserved portion of the second thin film layer; ashing the substrate that has been passivated to remove a portion of the photoresist pattern layer within the photoresist-partially-reserved region; performing a third etching on the substrate that has been subject to the ashing and the second etching to remove a portion of the reserved portion of the second thin film layer corresponding to the photoresist-partially-reserved region to form a second pattern layer; and, stripping the substrate that has been subject to the third etching to remove the remaining portion of the photoresist pattern layer.

Further, the first pattern layer is a pattern layer containing a semiconductor active layer, and the second pattern layer is a pattern layer containing source electrodes, drain electrodes and data lines; or, the first pattern layer is a pattern layer containing transparent electrodes, and the second pattern layer is a pattern layer containing gate electrodes.

Further, the step of performing a second etching on the substrate that has been subject to the first etching follows the step of ashing the substrate that has been passivated.

Further, the step of passivating the substrate that has been subject to the first etching to form a protective layer on an exposed surface of a reserved portion of the second thin film layer is: passivating the substrate that has been subject to the second etching to form a protective layer on an exposed surface of a reserved portion of the second thin film layer.

Further, the step of passivating the substrate that has been subject to the first etching to form a protective layer on an exposed surface of a reserved portion of the second thin film layer includes: placing the substrate that has been subject to the first etching into a passivation reaction system so that the exposed surface of the reserved portion of the second thin film layer has been passivated to form a protective layer.

Further, the step of passivating the substrate that has been subject to the first etching to form a protective layer on an exposed surface of a reserved portion of the second thin film layer further includes: connecting an anode of an external power supply to the reserved portion of the second thin film layer on the substrate that has been subject to the first etching so that the reserved portion of the second thin film layer on the substrate and the external power supply form a closed circuit through the passivation reaction system.

Further, the reserved portion of the second thin film layer formed by performing the first etching on the substrate that is exposed and developed includes a plurality of data lines and a source-drain connection pattern located within a display region, and a connection portion located within a non-display region, wherein, the connection portion connects ends of the plurality of data lines; and, the anode of the external power supply applies an anode electrical signal to the data lines and the source-drain connection pattern through the connection portion.

Further, the second pattern layer formed by performing the third etching on the substrate that has been subject to the ashing and the second etching includes, at the connection portion, source electrodes and drain electrodes of a plurality of thin film transistors, and signal lines for connecting the source electrodes of the plurality of the thin film transistors, wherein, the drain electrodes of the plurality of thin film transistors are connected to the ends of the plurality of data lines in one-to-one correspondence.

Further, the step of passivating the substrate that has been subject to the first etching to form a protective layer on an exposed surface of a reserved portion of the second thin film layer includes: performing plasma passivation on the substrate that has been subject to the first etching so that a passivation reaction occurs between the exposed surface of the reserved portion of the second thin film layer and ions in the plasma to form a protective layer.

Further, the step of ashing the substrate that has been passivated to remove a portion of the photoresist pattern layer within the photoresist-partially-reserved region includes: performing a first ashing on the substrate that has been passivated to remove a portion of the photoresist pattern layer within the photoresist-partially-reserved region, and performing a second ashing on the substrate that has been subject to the first ashing to remove the remaining portion of the photoresist pattern layer within the photoresist-partially-reserved region; and, the step of performing a second etching on the substrate that has been subject to the first etching to remove a portion of the first thin film layer corresponding to the photoresist-removed region to form a first pattern layer inclues: performing a second etching on the substrate that has been subject to the first ashing and not yet subject to the second ashing to remove a portion of the first thin film layer corresponding to the photoresist-removed region to form a first pattern layer.

Another aspect of the embodiments of the present disclosure further provides an array substrate, including two stacked pattern layers, wherein at least one of the two stacked pattern layers is formed by one of the patterning methods described above.

Still another aspect of the present disclosure further provides a display device, including the array substrate described above.

BRIEF DESCRIPTION OF THE DRAWINGS

To describe the technical solutions in the embodiments of the present disclosure or in the prior art more clearly, the accompanying drawings to be used in the descriptions of the embodiments or the prior art will be briefly described below. Apparently, the accompanying drawings described hereinafter are some of embodiments of the present disclosure, and a person of ordinary skill in the art can obtain other accompanying drawings according to these drawings without paying any creative effort.

FIG. 11b is a partial connection diagram of the pattern layers in FIG. 11a;

DETAILED DESCRIPTION

The technical solutions in the embodiments of the present disclosure will be clearly and completely described below with reference to the accompanying drawings in the embodiments of the present disclosure. Apparently, the embodiments described herein are merely a part but not all of the embodiments of the present disclosure. All other embodiments obtained by a person of ordinary skill in the art without paying any creative effort on the basis of the embodiments in the present disclosure shall fall into the protection scope of the present disclosure.

FIGS. 1(a)-1(g) are structure diagrams of an array substrate manufactured by a patterning method employing a half tone mask. For example, the array substrate may be an array substrate using amorphous silicon for a Thin Film Transistor-Liquid Crystal Display (a-Si TFT-LCD, for short). During the manufacturing process, a pattern layer of source/drain electrodes and data lines and a pattern layer of semiconductor active layer are formed by the patterning method employing a half tone mask. As shown in FIGS. 1(a)-1(g), a semiconductor layer 20, a metal layer 30 and a photoresist thin film layer 40 are successively formed on a substrate 10; and exposure, developing, a first etching, a second etching, ashing, a third etching and stripping (specifically referring to FIGS. 1(a)-1(g)) are performed on the substrate to form a pattern layer of source/drain electrodes and data lines in the metal layer 30 and form a pattern layer of semiconductor active layer in the semiconductor layer 20. Of course, for the a-Si TFT-LCD, a fourth etching is further performed between the third etching and the stripping to remove an N+a-Si layer with high conductivity in the pattern layer of semiconductor active layer between the corresponding source electrodes and drain electrodes, so that the normal operation of the TFT is ensured.

Figures 1A, 1B, 1C, 1D, 1E, 1F, 1G:
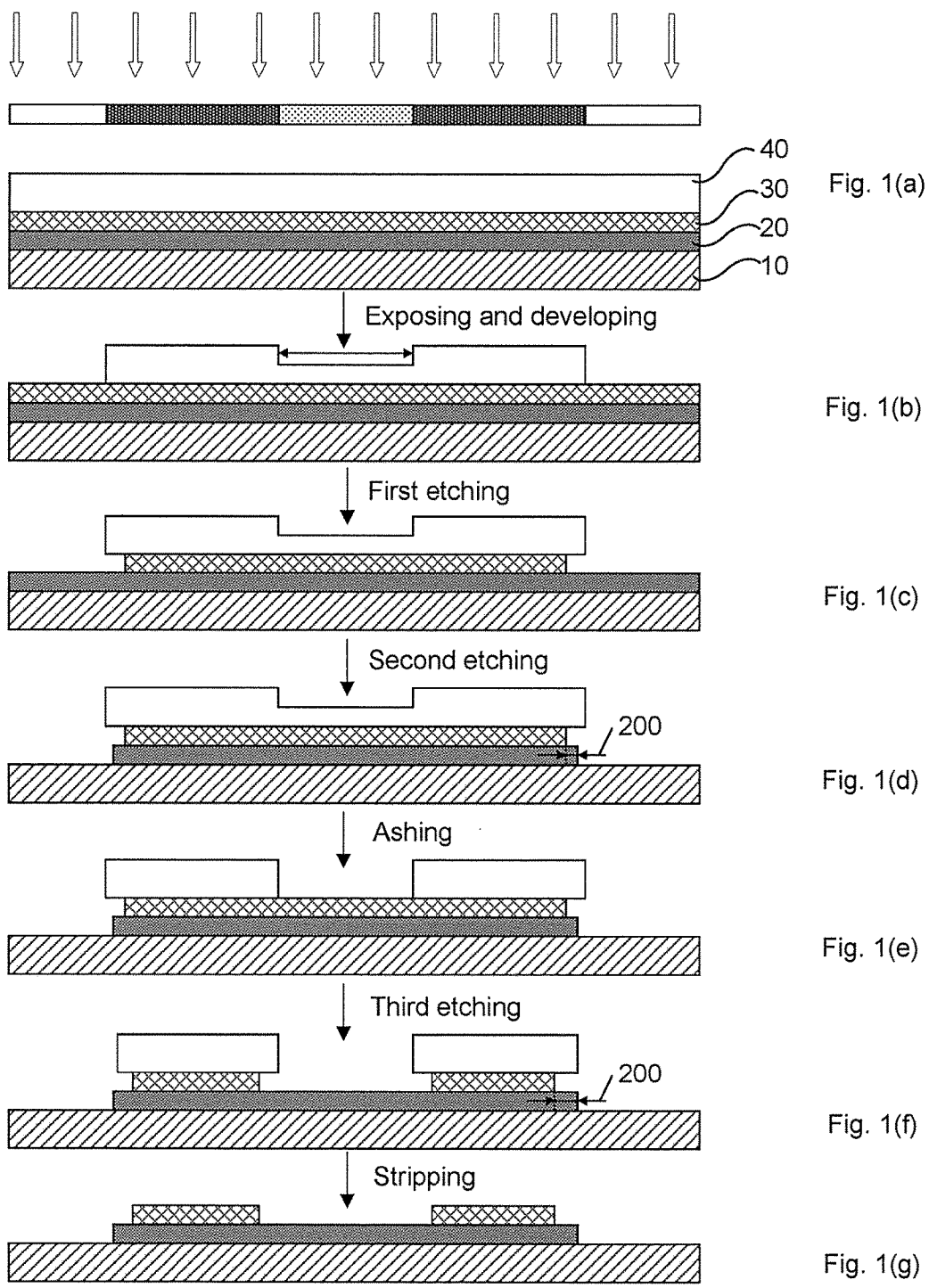
FIGS. 1(a)-1(g) are structure diagrams of an array substrate manufactured by a patterning method employing a half tone mask.

Since there are some process differences between the first etching and the second etching, as shown in FIG. 1(d), the pattern in the semiconductor layer 20 has a tail 200 relative to the pattern in the metal layer 30. In addition, at the end of the third etching, as shown in FIG. 1(f), the tail 200 is further enlarged since the pattern formed in the metal layer 30 is further etched by the third etching. The tail 200 plays no role in the conduction of data line signals and will result in a high concentration of photo-generated carriers under illumination. As a result, stray capacitance between a data line and a gate electrode in the TFT and between a pixel electrode and a common electrode in the LCD is increased. Accordingly, an adverse effect is caused to display pictures, and power consumption of the display device is increased.

Figure 2:
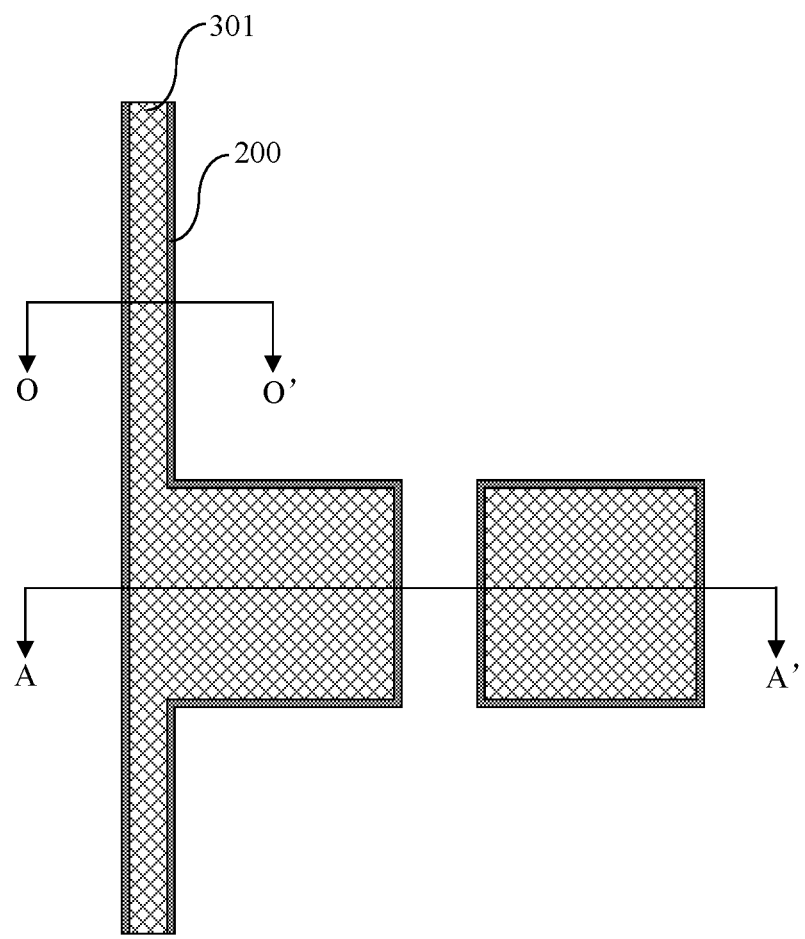
FIG. 2 is a schematic diagram of a pattern layer formed by a patterning method employing a half tone mask.

In addition, as shown in FIG. 2, an electrical field will be generated between the tail 200 in the pattern layer of semiconductor active layer below data lines 301 in the pattern layer of source/drain electrodes and data lines formed by the patterning method employing a half tone mask and a common electrode in the display device, so that the deflection of liquid crystal molecules is influenced and the light leakage is caused. If a light leak is occluded by means of increasing the width of a black matrix, the aperture rate is thus reduced.

Embodiments of the present disclosure provide a patterning method employing a half tone mask, an array substrate and a display device, by which a tail of a pattern layer close to a side of a substrate in two adjacent pattern layers on the substrate can be reduced.

The embodiments of the present disclosure provide a patterning method employing a half tone mask. With the patterning method employing a half tone mask, one exposure and multiple times of etching can be performed on two thin film layers to form two film patterns. The two film patterns can be a pattern layer containing a semiconductor active layer and a pattern layer containing source electrodes, drain electrodes and data lines, or a pattern layer containing transparent electrodes and a pattern layer containing gate electrodes. Of course, the two film patterns can also be two other film patterns, and will not be limited in the present disclosure. The following embodiments will be described by taking the two film patterns being a pattern layer containing a semiconductor active layer and a pattern layer containing source electrodes, drain electrodes and data lines as example.

Figure 3:
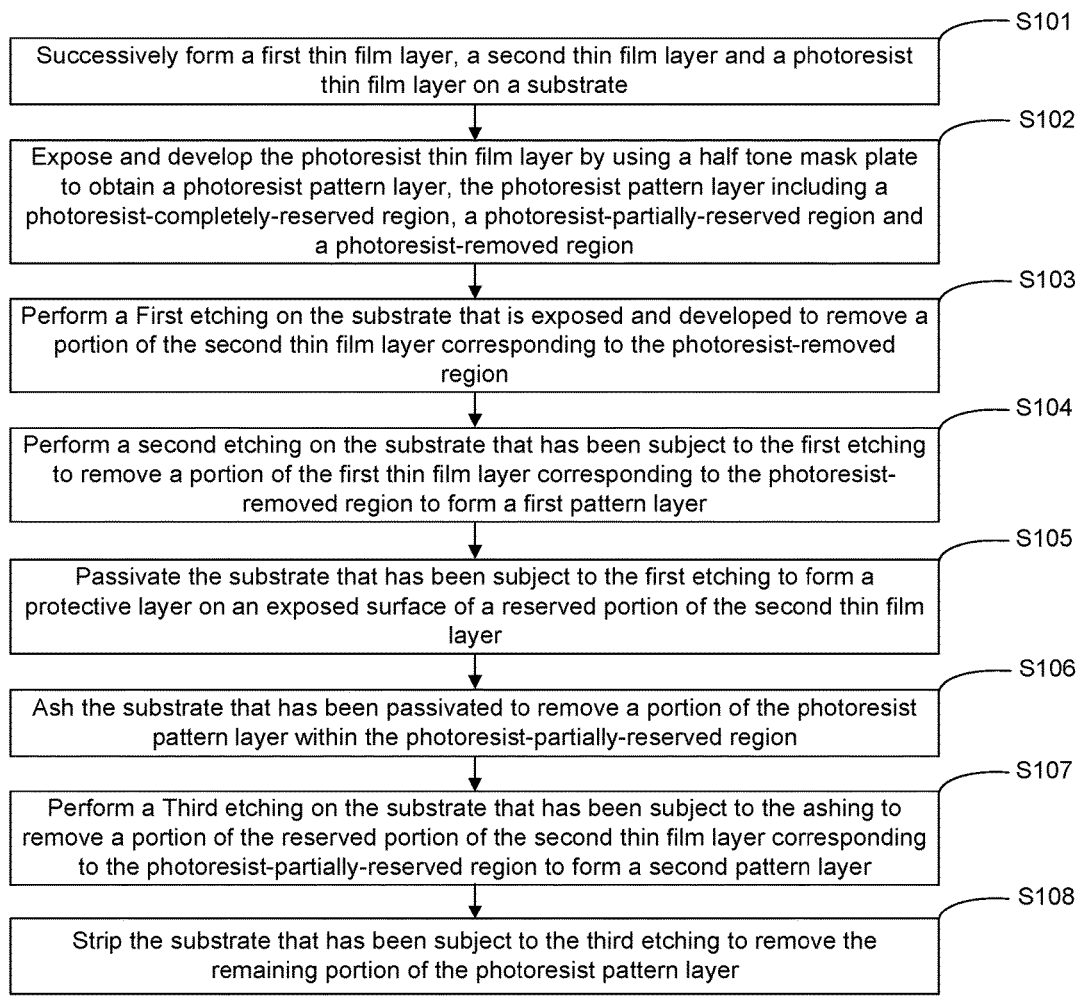
FIG. 3 is a flowchart of a patterning method employing a half tone mask according to the embodiments of the present disclosure.

As shown in FIG. 3, the patterning method employing a half tone mask includes the following steps, and the following steps arranged in order do not indicate that they must be performed in sequence.

Figure 4:
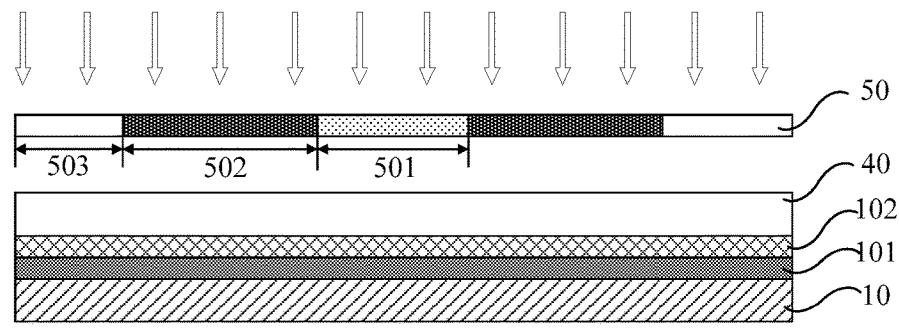
FIG. 4 is a structure diagram of an array substrate manufactured by the patterning method employing a half tone mask according to the embodiments of the present disclosure.

In step S101, as shown in FIG. 4, a first thin film layer 101, a second thin film layer 102 and a photoresist thin film layer 40 are successively formed on a substrate 10.

Specifically, the first thin film layer 101 may be mainly made of semiconductor material, and the second thin film layer 102 may be mainly made of metal material.

Figure 5:
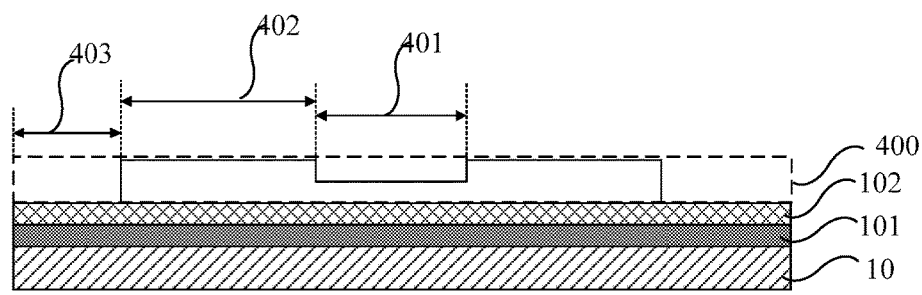
FIG. 5 is a structure diagram of an array substrate manufactured by the patterning method employing a half tone mask according to the embodiments of the present disclosure.

In step S102, as shown in FIG. 4, the photoresist thin film layer 40 is exposed and developed by using a half tone mask plate 50 to obtain a photoresist pattern layer 400, as shown in FIG. 5. The photoresist pattern layer 400 includes a photoresist-partially-reserved region 401, a photoresist-completely reserved region 402 and a photoresist-removed region 403.

As shown in FIG. 4, the half tone mask plate 50 includes a semi-translucent region 501, an opaque region 502 and a translucent region 503. By taking the photoresist thin film layer 40 being a positive photoresist as example, the semi-translucent region 501 of the half tone mask plate 50 corresponds to the photoresist-partially-reserved region 401 in the photoresist pattern layer 400, the opaque region 502 corresponds to the photoresist-completely reserved region 402 in the photoresist pattern layer 400, and the translucent region 503 corresponds to the photoresist-removed region 403 in the photoresist pattern layer 400.

In step S103, a first etching E1 is performed on the substrate that is exposed and developed in FIG. 5 to remove a portion of the second thin film layer 102 corresponding to the photoresist-removed region 403 to obtain a reserved portion 1021 of the second thin film layer.

Figure 6:
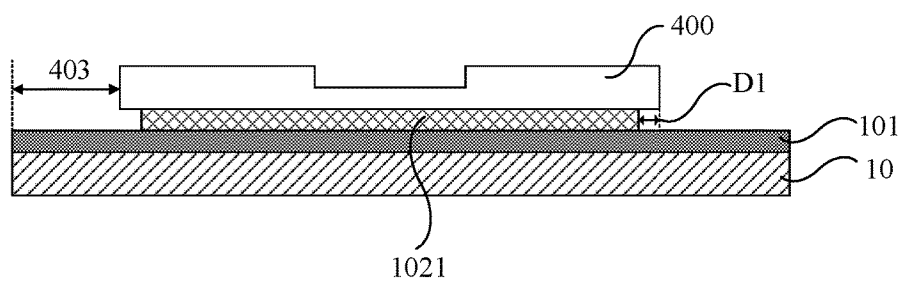
FIG. 6 is a structure diagram of an array substrate manufactured by the patterning method employing a half tone mask according to the embodiments of the present disclosure.

Specifically, the second thin film layer 102 is mainly made of metal material. A portion of the second thin film layer 102 corresponding to the photoresist-removed region 403 (i.e., a portion not covered with the photoresist in the second thin film layer 102), may be etched by wet etching. It is to be noted that, during the etching process, etching liquid (e.g., nitric acid, phosphoric acid, etc.) will etch an edge of a metal layer in a portion covered with the photoresist when it reacts with the metal in the second thin film layer 102 to remove a metal layer in a portion not covered with the photoresist, so that a critical dimension bias (CD-Bias) will be caused to the reserved portion 1021 of the second thin film layer. In other words, as shown in FIG. 6, the reserved portion 1021 of the second thin film layer obtained by the first etching E1 has a certain transverse indentation D1 relative to the photoresist pattern layer 400. Of course, considering the transverse indentation for the etching, during arrangement and design of the mask plate, the width of a pattern at a corresponding position of the photoresist-completely-reserved region 402 will be increased properly.

In step S104, a second etching E2 is performed on the substrate that has been subject to the first etching E1 to remove a portion of the first thin film layer 101 corresponding to the photoresist-removed region 403 to form a first pattern layer 1011.

Specifically, the first thin film layer 101 is mainly made of semiconductor material. A portion of the first thin film layer 101 corresponding to the photoresist-removed region 403 (i.e., a region of the first thin film layer 101 that is not covered with the photoresist and not covered by the reserved portion 1021 of the second thin film layer), may be etched by dry etching. Of course, as shown in FIG. 7, an etching gas will etch an edge of the semiconductor material in a portion covered with the photoresist when it removes the semiconductor material in a portion of the first thin film layer 101 not covered with the photoresist, so that the first pattern layer 1011 obtained by the second etching E2 has a certain transverse indentation D2 relative to the photoresist pattern layer 400.

However, due to the difference between the dry etching process and the wet etching process as well as different thickness and material of the first thin film layer 101 and the second thin film layer 102, the transverse indentation D2 is less than the transverse indentation D1, so that the first pattern layer 1011 has a tail 200 relative to the reserved portion 1021 of the second thin film layer. During a practical manufacturing process, generally, by controlling the process conditions, the transverse indentation D1 of the reserved portion 1021 of the second thin film layer relative to the photoresist pattern layer 400 can be decreased as far as possible, so that the tail 200 of the first pattern layer 1011 relative to the reserved portion 1021 of the second thin film layer is reduced.

Figure 7:
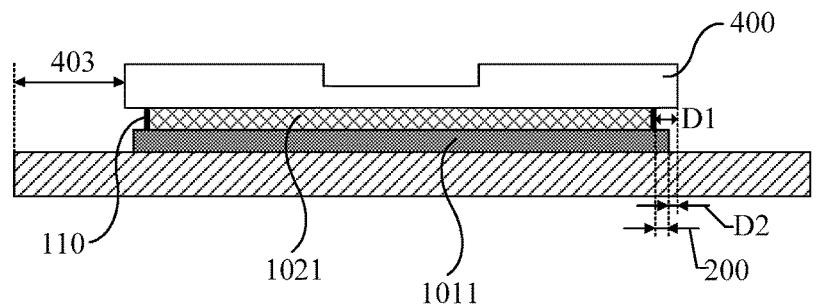
FIG. 7 is a structure diagram of an array substrate manufactured by the patterning method employing a half tone mask according to the embodiments of the present disclosure.

In step S105, the substrate that has been subject to the first etching E1 is passivated to form a protective layer 110 on an exposed surface of the reserved portion 1021 of the second thin film layer, as shown in FIG. 7.

Figure 13:
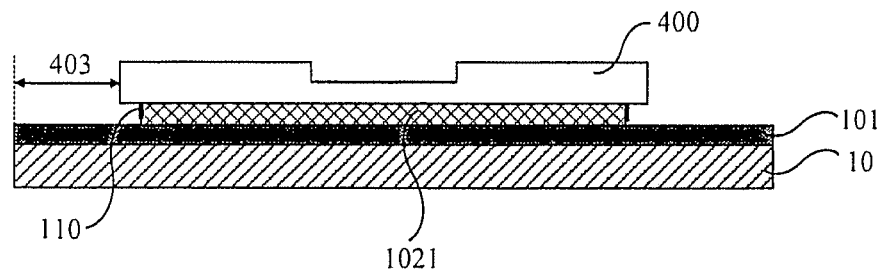
FIG. 13 is a structure diagram of an array substrate manufactured by the patterning method employing a half tone mask according to the embodiments of the present disclosure.

It is to be noted that, as shown in FIG. 13, the step of passivating the substrate that has been subject to the first etching may be performed after the first etching E1 in the step S103 and before the second etching E2 in the step S104 to form a protective layer 110 on the exposed surface of the reserved portion 1021 of the second thin film layer. Alternatively, the step of passivating the substrate that has been subject to the first etching may follow the second etching E2 in the step S104 to form a protective layer 110 on the exposed surface of the reserved portion 1021 of the second thin film layer.

By passivating the exposed surface of the reserved portion 1021 of the second thin film layer after the second etching E2, the exposed surface of the reserved portion 1021 of the second thin film layer can be protected by the passivation, and the exposed surface of the first pattern layer 1011 can also be protected to a certain extent.

Figure 8A:
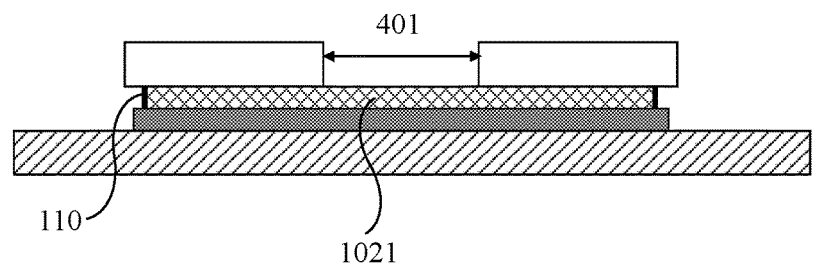
FIG. 8a is a structure diagram of an array substrate manufactured by the patterning method employing a half tone mask according to the embodiments of the present disclosure.

In step S106, the substrate that has been passivated is ashed to remove a portion of the photoresist pattern layer 400 within the photoresist-partially-reserved region 401, as shown in FIG. 8a.

The ashing process in the step S106 may follow the second etching E2 in the step S104. For example, the passivation process in the step S105 follows the first etching E1 in the step S103, and is followed by the second etching E2 in the step 104 and then the ashing process in the step S106.

Figure 14:
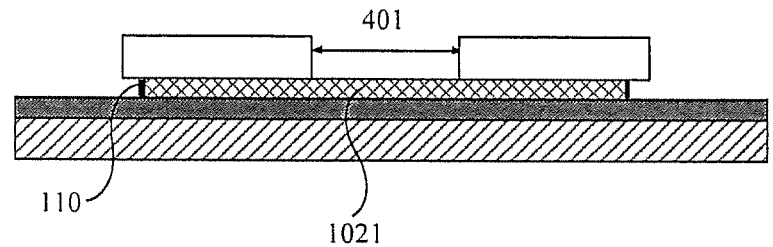
FIG. 14 is a structure diagram of an array substrate manufactured by the patterning method employing a half tone mask according to the embodiments of the present disclosure.

Of course, as shown in FIGS. 14 and 8a, the ashing process in the step S106 may be performed before the second etching E2 in the step S104. For example, the passivation process in the step S105 follows the first etching E1 in the step S103, and is followed by the ashing process in the step S106 and then the second etching E2 in the step 104. In this way, since the ashing process is performed before the second etching E2, the photoresist pattern layer 400 has a certain transverse indentation at the end of the ashing process. Accordingly, a portion of the thin film layer 101 corresponding to the transverse indentation of the photoresist-removed region 403 can be etched by the second etching E2, so that the tail 200 of the first pattern layer 1011 relative to the reserved portion 1021 of the second thin film layer in FIG. 7 is reduced.

It is to be noted that, FIG. 5 to FIG. 8a are cross-sectional views of the substrate at a position of a source electrode and a drain electrode formed in the second thin film layer 102. For example, FIG. 5 to FIG. 8a correspond to cross-sectional views taken along A-A' in FIG. 2. FIG. 8b is a cross-sectional view of the substrate at a position of a data line formed in the second thin film layer 102. For example FIG. 8b corresponds to a cross-sectional view taken along O-O' in FIG. 2. In order to clearly show the transverse indentations during the ashing process and the etching process, FIG. 8b is magnified with respect to FIG. 5 to FIG. 8a. That is, FIG. 8b is not drawn in proportions with FIG. 5 to FIG. 8a. As shown in FIG. 8b, by taking a corresponding portion of a data line 301 as example, the process of performing ashing and then second etching E2 will be further described.

Usually, under situation of performing ashing and then second etching, the transverse indentation of the photoresist pattern layer during the ashing process is greater than the critical dimension bias (CD-Bias) generated in the reserved portion of the second thin film layer during the first etching. Therefore, at the end of the ashing process, the reserved portion of the second thin film layer may have a non-passivated and exposed upper surface, and the exposed surface will be etched during the subsequent etching process, resulting in adverse effects.

In the embodiments of the present disclosure, by increasing the etching time of the first etching E1, the transverse indentation D1 of the reserved portion 1021 of the second thin film layer relative to the photoresist pattern layer 400 can be increased, so that the non-passivated supper surface of the reserved portion 1021 of the second thin film layer will not be exposed by the ashing process. On this basis, since the passivation process is performed before the ashing process, it basically may be ensured that the critical dimension bias (CD-Bias) caused by performing subsequent etching on the reserved portion 1021 of the second thin film layer is reduced almost to zero.

Figure 8B:
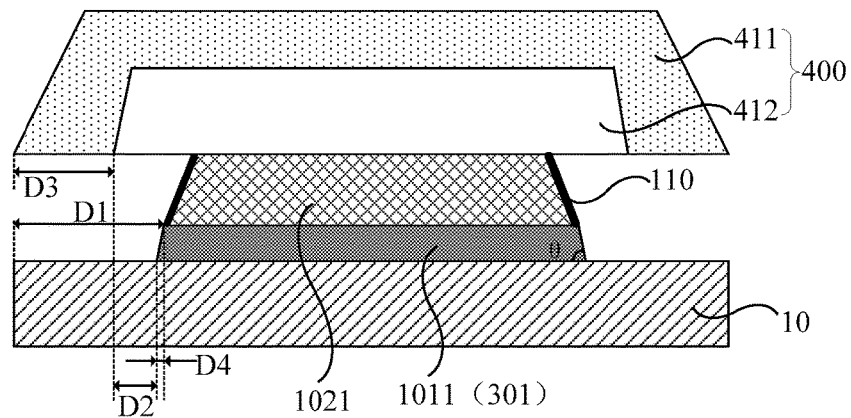
FIG. 8b is a structure diagram of an array substrate manufactured by the patterning method employing a half tone mask according to the embodiments of the present disclosure.

In FIG. 8b, a portion to be removed during the ashing process is indicated by 411, a transverse indentation of the photoresist pattern layer 400 to be formed during the ashing process is indicated by D3, and a portion to be reserved after the ashing process is indicated by 412. By controlling the etching time of the first etching E1 and the degree of ashing, as shown in FIG. 8b, the sum of the transverse indentation D3 of the photoresist pattern layer 400 during the ashing process and the transverse indentation D2 of the first pattern layer 1011 relative to the photoresist pattern layer 400 is as close as possible to the transverse indentation D1 of the reversed portion 1021 of the second thin film layer relative to the photoresist pattern layer 400, that is, D1-D2-D3=D4, where D4 is the transverse width of a side face of the first pattern layer 1011 having a certain angle θ of gradient after the etching. Accordingly, the bottom of the reserved portion 1021 of the second thin film layer is aligned to the top of the first pattern layer 1011, and the non-passivated lower surface of the reserved portion 1021 of the second thin film layer may be prevented from exposure.

In this case, the tail 200 (D4 in FIG. 8b) of the first pattern layer 1011 relative to the reserved portion 1021 of the second thin film layer may be minimal. By taking the angle θ of gradient of the first pattern layer 1011 after etching being equal to 70° and thickness of the first pattern layer 1011 being equal to 0.2 μm as example, D4=0.2/tan 70°=0.07 μm. Of course, in the practical production, considering a process fluctuation (e.g., ±0.3 μm), D1-D2-D3 can be adjusted to 0.4 μm (which is an approximate value of 0.3+0.07). Thus, it may be ensured that the non-passivated surface of the reserved portion 1021 of the second thin film layer will not be exposed, the protective layer 110 basically plays its full role, and the tail 200 of the first pattern layer 1011 relative to the reserved portion 1021 of the second thin film layer may be minimal.

Figure 9:
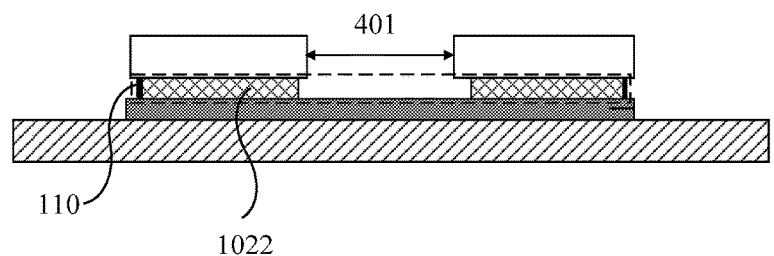
FIG. 9 is a structure diagram of an array substrate manufactured by the patterning method employing a half tone mask according to the embodiments of the present disclosure.

In step S107, a third etching E3 is performed on the substrate that has been subject to the ashing and the second etching E2 to remove a portion of the reserved portion 1021 of the second thin film layer corresponding to the photoresist-partially-reserved region 401 (FIG. 8a), to form a second pattern layer 1022 as shown in FIG. 9.

Specifically, during the third etching E3 of the reserved portion 1021 of the second thin film layer, since the exposed surface of the reserved portion 1021 of the second thin film layer has been passivated before this step, as shown in FIG. 8b, there is a protective layer 110 on the exposed surface of the reserved portion 1021 of the second thin film layer. When the third etching E3 is performed on a portion of the reserved portion 1021 of the second thin film layer corresponding to the photoresist-partially-reserved region 401, under the protection of the protective layer 110, the exposed surface having the protective layer 110 basically will not be further etched, that is, the critical dimension bias (CD-Bias) of the second thin film layer 102 after the third etching E3 is almost zero. Therefore, it is ensured that the tail 200 of the first pattern layer 1011 relative to the reserved portion 1021 of the second thin film layer basically will not be further increased. Accordingly, the stray capacitance resulted from the tail is decreased, the adverse effect on display pictures is reduced, the power consumption of the display device is reduced, and the light leakage caused by the position of the data lines may be avoided.

Figure 10:
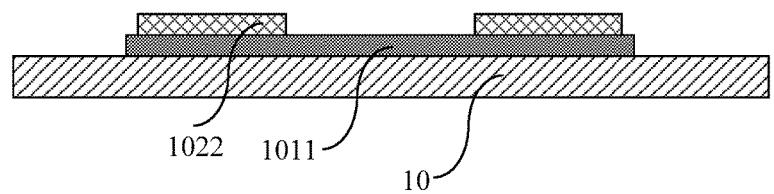
FIG. 10 is a structure diagram of an array substrate manufactured by the patterning method employing a half tone mask according to the embodiments of the present disclosure.

In step S108, the substrate that has been subject to the third etching E3 is stripped to remove the remaining portion of the photoresist pattern layer, as shown in FIG. 10, and the first pattern layer 1011 and the second pattern layer 1022 are reserved on the substrate 10.

It is to be noted that, there may be other film patterns (not shown) on the substrate 10, and only the film patterns related to the present disclosure are shown.

In addition, for an a-Si TFT-LCD, a fourth etching is further performed between the third etching and the stripping process to remove an N+ a-Si layer with high conductivity in the semiconductor active pattern layer between corresponding source electrodes and drain electrodes, so that the normal operation of the TFT is ensured. This will not be repeated with reference to the drawings.

In conclusion, with the patterning method employing a half tone mask, stacked first and second pattern layers can be formed by performing one exposure and multiple times of etching on the stacked first and second thin film layers. Identical or nearly identical patterns are formed on the two stacked thin film layers at the end of the first etching and the second etching, and both the first etching and the third etching are conducted on the second thin film layer. On this basis, in the present disclosure, by passivating the substrate that has been subject to the first etching, a protective layer can be formed on an exposed surface of a reserved portion of the second thin film layer after the first etching. In this way, even the third etching is performed on the second thin film layer, the exposed surface of the reserved portion of the second thin film layer will not be further etched by the third etching since the protective layer has been formed, by passivation, on the exposed surface of the reserved portion of the second thin film layer that has been subject to the first etching. Consequently, a tail of the first pattern layer relative to the second pattern layer is reduced.

The passivation process in the step S105 will be further described below by specific embodiments.

Embodiment 1

In the step S105, the step of passivating the substrate that has been subject to the first etching E1 to form a protective layer 110 on an exposed surface of the reserved portion 1021 of the second thin film layer may specifically include: placing the substrate that has been subject to the first etching E1 into a passivation reaction system so that the exposed surface of the reserved portion 1021 of the second thin film layer is passivated to form a protective layer 110.

Specifically, the existing second thin film layer 102 mainly made of metal material is generally composited by a plurality of metal layers of molybdenum-aluminum-molybdenum. The exposed surface of the reserved portion 1021 of the second thin film layer can be passivated under certain reaction conditions by a passivant (e.g., concentrated nitric acid, potassium dichromate, potassium permanganate or other passivating liquid), and the passivated metal is difficultly etched again so that certain protection effect is realized. Furthermore, the critical dimension bias (CD-Bias) of data lines, source electrodes and drain electrodes formed by performing two times of etching on the second thin film layer 102 can be controlled to be nearly zero during the second etching.

It is to be noted that, with regard to the wet etching, there are generally a plurality of etching intervals and a plurality of washing intervals. In this case, passivating intervals for passivation may be arranged between the etching intervals and the washing intervals. After the second thin film layer 102 is etched by the etching liquid within the etching intervals, the exposed surface of the reserved portion 1021 of the second thin film layer is passivated by the passivating liquid within the passivating intervals and then washed within the washing intervals.

Further, in order to quicken the rate of the passivation reaction and improve the passivation efficiency, the step S105 may further include: connecting an anode of an external power supply to the reserved portion 1021 of the second thin film layer on the substrate that has been subject to the first etching E1 so that the reserved portion 1021 of the second thin film layer on the substrate and the external power supply form a closed circuit through the passivation reaction system.

It is to be noted that, in the embodiments of the present disclosure, the anode of the external power source is connected to the reserved portion 1021 of the second thin film layer on the substrate that has been subject to the first etching E1, and the cathode of the external power source is not limited. For example, the cathode of the external power supply can be connected to the passivating liquid of the passivation reaction system.

In this case, during a chemical reaction of the reserved portion 1021 of the second thin film layer with the passivating liquid, an electrolysis reaction occurs simultaneously. The electrolysis reaction may facilitate the reaction of the reserved portion 1021 of the second thin film layer in the passivating liquid, so that the passivation efficiency is improved.

Figure 11A:
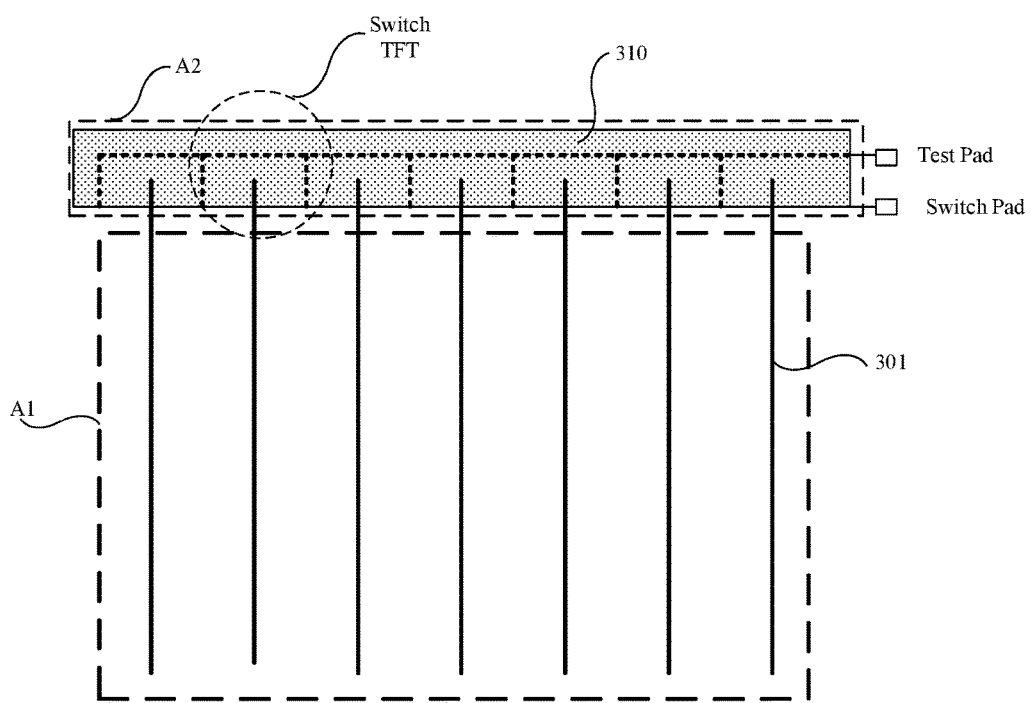
FIG. 11a is a connection diagram of pattern layers during the passivation process according to the embodiments of the present disclosure.
Figure 15:
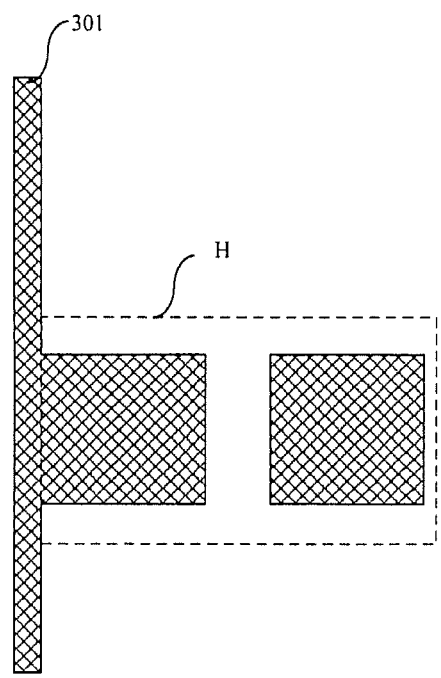
FIG. 15 is a schematic diagram of a pattern layer formed by a patterning method employing a half tone mask according to the embodiments of the present disclosure.

In addition, the existing detection lines on the substrate may be utilized to allow the reserved portion 1021 of the second thin film layer and the external power supply to form a closed circuit, so as to simplify the process and reduce the cost. As shown in FIGS. 11a and 15, the reserved portion 1021 of the second thin film layer formed by performing first etching E1 on the substrate that is exposed and developed includes data lines and a source-drain connection pattern H located within a display region A1, and a connection portion 310 located within a non-display region A2, and the connection portion 310 connects ends of all the data lines 301. Within the display region A1 in FIG. 11a, only the data lines 301 are illustrated, and the source-drain connection pattern is not shown.

Source electrodes and drain electrodes of the preformed switch TFTs are not formed in the connection portion 310 after the first etching E1. In this case, the connection portion 310 is of an integral structure for connecting the data lines and the source-drain connection pattern in the display region A1 as a whole, and the connection portion 310 is provided with a test pad for inputting signals. Of course, the connection portion 310 further includes a switch pad for controlling the preformed switch TFT. Since the switch pad is covered by a gate insulating layer below the connection portion 310, the switch pad does not work.

Figure 11B:
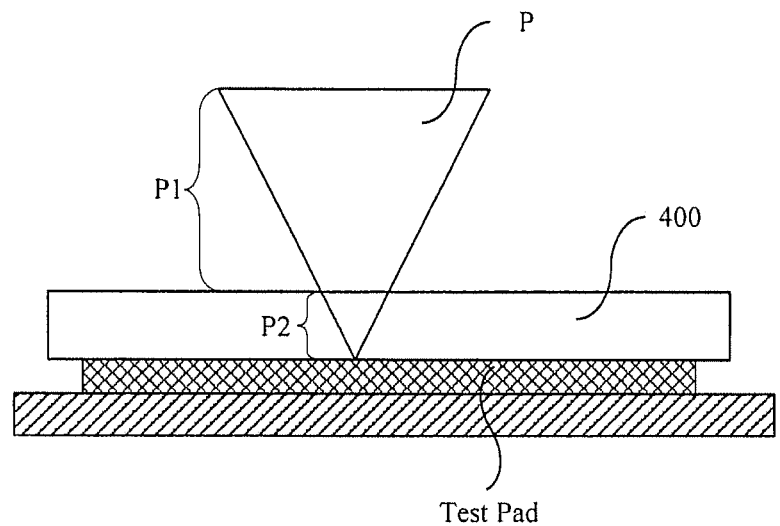

In this case, as shown in FIG. 11b, a probe P connected to the anode of the external power supply penetrates through the photoresist pattern layer 400 and then comes into contact with the test pad. The test pad is directly connected to the data lines and the source-drain connection pattern in the display region A1 as a whole through the connection portion 310. A portion P1 of the probe P not entering the photoresist pattern layer 400 has been subject to a surface insulating treatment, and a portion P2 (about 1 μm to 2 μm) of the probe entering the photoresist pattern layer 400 is a conductive portion. In addition, the cathode of the external power supply directly comes into contact with the passivating liquid in the passivation reaction system, so that the reserved portion 1021 of the second thin film layer on the substrate and the external power supply form a closed circuit through the passivation reaction system. Consequently, the electrolysis reaction occurs.

On this basis, the specific process of forming the source electrodes and drain electrodes of the preformed switch TFTs in the connection portion 310 is consistent with the process of forming the source electrodes and drain electrodes in the display region A1. During the third etching E3 in the above step, the connection portion 310 is etched to form source electrodes and drain electrodes of a plurality of switch TFTs and signal lines (a dashed portion within the non-display region A2 in FIG. 11a) for connecting all the switch TFTs, wherein the drain electrodes of the switch TFTs are connected to the ends of the data lines 301 in one-to-one correspondence.

Embodiment 2

In the step S105, the step of passivating the substrate that has been subject to the first etching E1 to form a protective layer 110 on an exposed surface of the reserved portion 1021 of the second thin film layer may specifically include: performing plasma passivation on the substrate that has been subject to the first etching E1 so that a passivation reaction occurs between the exposed surface of the reserved portion 1021 of the second thin film layer and ions in the plasma to form a protective layer 110.

Specifically, high-concentration fluorine and nitrogen plasma can be used. By controlling plasma sources (Souse RF Power and Bias RF Power) and thus controlling the ion concentration of the plasma and the direction of movement of ions, during the plasma passivation, a protective layer of fluorides and nitrides is formed on the exposed surface of the reserved portion 1021 of the second thin film layer.

Figure 16:
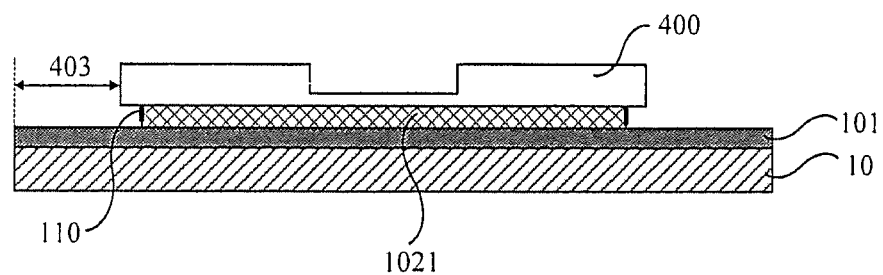
FIG. 16 is a structure diagram of an array substrate manufactured by the patterning method employing a half tone mask according to the embodiments of the present disclosure.
Figure 17:
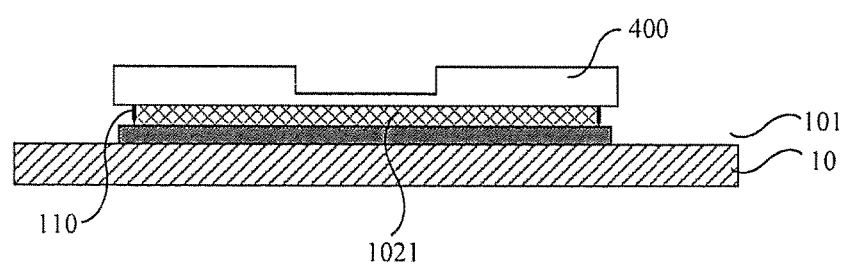
FIG. 17 is a structure diagram of an array substrate manufactured by the patterning method employing a half tone mask according to the embodiments of the present disclosure.

On this basis, in the present disclosure, in order to further reduce the tail 200 of the first pattern layer 1011 relative to the reserved portion 1021 of the second thin film layer, as shown in FIGS. 16 and 17, the step S106 of ashing the substrate that has been passivated to remove a portion of the photoresist pattern layer 400 within the photoresist-partially-reserved region 401 specifically includes a first ashing and a second ashing. The second etching E2 in the step S104 is performed between the first ashing and the second ashing.

Specifically, as shown in FIG. 16, the first ashing is performed on the substrate that has been passivated to remove a portion of the photoresist pattern layer within the photoresist-partially-reserved region 401. Then, as shown in FIG. 17, the second etching E2 is performed on the substrate that has been subject to the first ashing to remove a portion of the first thin film 101 corresponding to the photoresist-removed region 403 to form a first pattern layer 1011. And then, as shown in FIG. 8a the second ashing is performed on the substrate that has been subject to the second etching E2 to remove the remaining portion of the photoresist pattern layer within the photoresist-partially-reserved region 401.

Figure 12:
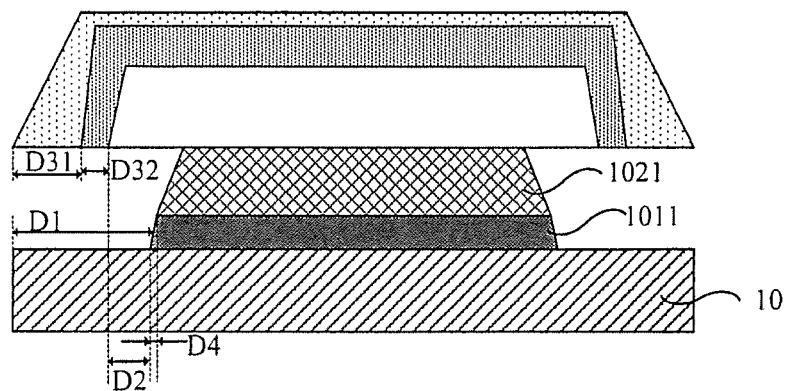
FIG. 12 is a structure diagram of an array substrate manufactured by the patterning method employing a half tone mask according to the embodiments of the present disclosure.

As shown in FIG. 12, by taking a corresponding portion of the data lines 301 (e.g. a cross-sectional view taken along O-O' in FIG. 2) as example, in order to ensure the bottom of the reserved portion 1021 of the second thin film layer to be aligned to the top of the first pattern layer 1011, and to ensure that the non-passivated surface of the reserved portion 1021 of the second thin film layer will not be exposed and that the tail 200 of the first pattern layer 1011 relative to the reserved portion 1021 of the second thin film layer is minimal, it is required to control the etching time of the first etching E1 and the degree of two times of ashing, so that a difference between the transverse indentation D1 of the reserved portion 1021 of the second thin film layer relative to the photoresist pattern layer 400 and the sum of the transverse indentations D31 and D32 of the photoresist pattern layer 400 during the first ashing process and the second ashing process and the transverse indentation D2 of the first pattern layer 1011 relative to the photoresist pattern layer 400 is equal to the transverse width D4 of a side face of the first pattern layer 1011 having a certain angle θ of gradient after the etching, that is, D1-D2-D31-D32=D4. Of course, considering a process fluctuation, the size of D1 can be properly increased by controlling the etching time of the first etching E1.

In addition, since dry etching and plasma passivation can be performed by a same apparatus, it is only required to adjust etching gas and plasma passivation gas. Therefore, when the second etching E2 is dry etching, the step of second etching E2 and the step of plasma passivation can be performed one after another, so that the process can be simplified and the manufacture cost can be reduced. For example, when the second etching E2 is performed between the first ashing and the second ashing, the plasma passivation can be performed between the second etching E2 and the second ashing.

An embodiment of the present disclosure provides an array substrate, including two stacked pattern layers, wherein at least one of the two stacked pattern layers is formed by the patterning method described above. The array substrate has the same beneficial effects as the patterning method employing a half tone mask provided in the foregoing embodiments. The patterning method employing a half tone mask and the beneficial effects thereof have been described in detail in the foregoing embodiments and will not be repeated here.

An embodiment of the present disclosure further provides a display device, including the array substrate. Like the array substrate, the display device has the same beneficial effects as the patterning method employing a half tone mask provided in the foregoing embodiments. The patterning method employing a half tone mask and the beneficial effects thereof have been described in detail in the foregoing embodiments and will not be repeated here.

It is to be noted that, in the embodiments of the present disclosure, the display device may specifically at least include a liquid crystal display panel and an organic light emitting diode display panel. For example, the liquid crystal display panel and the organic light emitting diode display panel may be applied to liquid crystal displays, liquid crystal TV sets, digital photo frames, mobile phones, tablet computers, or any other products or components having a display function.

The embodiments of the present disclosure provide a patterning method employing a half tone mask, an array substrate and a display device. The patterning method employing a half tone mask includes the steps of: successively forming a first thin film layer, a second thin film layer and a photoresist thin film layer on a substrate; exposing and developing the photoresist thin film layer by using a half tone mask plate to obtain a photoresist pattern layer, the photoresist pattern layer including a photoresist-completely-reserved region, a photoresist-partially-reserved region and a photoresist-removed region; performing a first etching on the substrate that is exposed and developed to remove a portion of the second thin film layer corresponding to the photoresist-removed region; performing a second etching on the substrate that has been subject to the first etching to remove a portion of the first thin film layer corresponding to the photoresist-removed region to form a first pattern layer; passivating the substrate that has been subject to the first etching to form a protective layer on an exposed surface of a reserved portion of the second thin film layer; ashing the substrate that has been passivated to remove a portion of the photoresist pattern layer within the photoresist-partially-reserved region; performing a third etching on the substrate that is ashed to remove a portion of the second thin film layer corresponding to the photoresist-partially-reserved region to form a second pattern layer; and, stripping the substrate that has been subject to the third etching to remove the remaining portion of the photoresist pattern layer.

In conclusion, with the patterning method employing a half tone mask, stacked first and second pattern layers can be formed by performing one exposure and multiple times of etching on the stacked first and second thin film layers. Identical or nearly identical patterns are formed on the two stacked thin film layers at the end of the first etching and the second etching, and both the first etching and the third etching are conducted on the second thin film layer. On this basis, in the present disclosure, by passivating the substrate that has been subject to the first etching, a protective layer can be formed on an exposed surface of a reserved portion of the second thin film layer after the first etching. In this way, even the third etching is performed on the second thin film layer, the exposed surface of the reserved portion of the second thin film layer will not be further etched by the third etching since the protective layer has been formed, by passivation, on the exposed surface of the reserved portion of the second thin film layer that has been subject to the first etching. Consequently, a tail of the first pattern layer relative to the second pattern layer is reduced.

Additional embodiments including any one of the embodiments described above may be provided by the disclosure, where one or more of its components, functionalities or structures is interchanged with, replaced by or augmented by one or more of the components, functionalities or structures of a different embodiment described above.

The foregoing descriptions merely show specific implementations of the present disclosure, and the protection scope of the present disclosure is not limited thereto. Any person of skill in the art can readily conceive of variations or replacements within the technical scope disclosed by the embodiments of the present disclosure, and these variations or replacements shall fall into the protection scope of the present disclosure. Accordingly, the protection scope of the present disclosure shall be subject to the protection scope of the claims.

What is claimed is:

1. A patterning method employing a half tone mask, comprising the steps of:
    successively forming a first thin film layer, a second thin film layer and a photoresist thin film layer on a substrate;
    exposing and developing the photoresist thin film layer by using a half tone mask plate to obtain a photoresist pattern layer, the photoresist pattern layer comprising a photoresist-completely-reserved region, a photoresist-partially-reserved region and a photoresist-removed region;
    performing a first etching on the substrate that is exposed and developed to remove a portion of the second thin film layer corresponding to the photoresist-removed region;
    performing a second etching on the substrate that has been subject to the first etching to remove a portion of the first thin film layer corresponding to the photoresist-removed region to form a first pattern layer;
    passivating the substrate that has been subject to the first etching to form a protective layer on an exposed surface of a reserved portion of the second thin film layer;
    ashing the substrate that has been passivated to remove a portion of the photoresist pattern layer within the photoresist-partially-reserved region;
    performing a third etching on the substrate that has been subject to the ashing and the second etching to remove a portion of the reserved portion of the second thin film layer corresponding to the photoresist-partially-reserved region to form a second pattern layer; and
    stripping the substrate that has been subject to the third etching to remove the remaining portion of the photoresist pattern layer, wherein
    the step of performing a second etching on the substrate that has been subject to the first etching follows the step of ashing the substrate that has been passivated.

2. The patterning method according to claim 1, wherein the first pattern layer is a pattern layer containing a semiconductor active layer, and the second pattern layer is a pattern layer containing source electrodes, drain electrodes and data lines; or, the first pattern layer is a pattern layer containing transparent electrodes and the second pattern layer is a pattern layer containing gate electrodes.

3. The patterning method according to claim 1, wherein the step of passivating the substrate that has been subject to the first etching to form a protective layer on an exposed surface of a reserved portion of the second thin film layer comprises:
    placing the substrate that has been subject to the first etching into a passivation reaction system so that the exposed surface of the reserved portion of the second thin film layer is passivated to form a protective layer.

4. The patterning method according to claim 3, wherein the step of passivating the substrate that has been subject to the first etching to form a protective layer on an exposed surface of a reserved portion of the second thin film layer further comprises:
    connecting an anode of an external power supply to the reserved portion of the second thin film layer on the substrate that has been subject to the first etching so that the reserved portion of the second thin film layer on the substrate and the external power supply form a closed circuit through the passivation reaction system.

5. The patterning method according to claim 4, wherein the reserved portion of the second thin film layer formed by performing the first etching on the substrate that is exposed and developed comprises a plurality of data lines and a source-drain connection pattern located within a display region, and a connection portion located within a non-display region, wherein, the connection portion connects ends of the plurality of data lines, and the anode of the external power supply applies an anode electrical signal to the data lines and the source-drain connection pattern through the connection portion.

6. The patterning method according to claim 5, wherein the second pattern layer formed by performing the third etching on the substrate that has been subject to the ashing and the second etching comprises, at the connection portion, source electrodes and drain electrodes and signal lines.

7. The patterning method according to claim 1, wherein the step of passivating the substrate that has been subject to the first etching to form a protective layer on an exposed surface of a reserved portion of the second thin film layer comprises:
performing plasma passivation on the substrate that has been subject to the first etching so that a passivation reaction occurs between the exposed surface of the reserved portion of the second thin film layer and ions in the plasma to form a protective layer.

8. An array substrate, comprising two stacked pattern layers, wherein at least one of the two stacked pattern layers is formed by the patterning method according to claim 1.

9. A display device, comprising the array substrate according to claim 8.

10. A patterning method employing a half tone mask, comprising the steps of:
successively forming a first thin film layer, a second thin film layer and a photoresist thin film layer on a substrate;
exposing and developing the photoresist thin film layer by using a half tone mask plate to obtain a photoresist pattern layer, the photoresist pattern layer comprising a photoresist-completely-reserved region, a photoresist-partially-reserved region and a photoresist-removed region;
performing a first etching on the substrate that is exposed and developed to remove a portion of the second thin film layer corresponding to the photoresist-removed region;
performing a second etching on the substrate that has been subject to the first etching to remove a portion of the first thin film layer corresponding to the photoresist-removed region to form a first pattern layer;
passivating the substrate that has been subject to the first etching to form a protective layer on an exposed surface of a reserved portion of the second thin film layer;
ashing the substrate that has been passivated to remove a portion of the photoresist pattern layer within the photoresist-partially-reserved region;
performing a third etching on the substrate that has been subject to the ashing and the second etching to remove a portion of the reserved portion of the second thin film layer corresponding to the photoresist-partially-reserved region to form a second pattern layer; and
stripping the substrate that has been subject to the third etching to remove the remaining portion of the photoresist pattern layer, wherein
the step of ashing the substrate that has been passivated comprises a first ashing and a second ashing; and the second etching is performed between the first ashing and the second ashing.

11. The patterning method according to claim 10, wherein the step of ashing the substrate that has been passivated to remove a portion of the photoresist pattern layer within the photoresist-partially-reserved region comprises: performing the first ashing on the substrate that has been passivated to remove a portion of the photoresist pattern layer within the photoresist-partially-reserved region; and, performing the second ashing on the substrate that has been subject to the first ashing to remove the remaining portion of the photoresist pattern layer within the photoresist-partially-reserved region; and
the step of performing a second etching on the substrate that has been subject to the first etching to remove a portion of the first thin film layer corresponding to the photoresist-removed region to form a first pattern layer comprises: performing a second etching on the substrate that has been subject to the first ashing and not yet subject to the second ashing to remove a portion of the first thin film layer corresponding to the photoresist-removed region to form a first pattern layer.

* * * * *